(12) United States Patent
Kasai

(10) Patent No.: US 6,469,309 B1
(45) Date of Patent: Oct. 22, 2002

(54) VACUUM SEALED SPECIMEN HOLDER SUPPORT WITH MOTION DAMPING MEANS

(75) Inventor: Tohru Kasai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 09/527,836

(22) Filed: Mar. 17, 2000

(30) Foreign Application Priority Data

Mar. 17, 1999 (JP) ............................................. 11-071360

(51) Int. Cl.[7] ............................ G21K 5/10; G21K 5/08; H01J 37/20
(52) U.S. Cl. ............................ 250/442.11; 250/440.11; 250/441.11
(58) Field of Search ....................... 250/440.11, 441.11, 250/442.11; 359/393; 414/217

(56) References Cited

U.S. PATENT DOCUMENTS

| | | | |
|---|---|---|---|
| 5,001,350 A | 3/1991 | Ohi et al. ................. | 250/440.1 |
| 5,581,088 A | * 12/1996 | Kasai .................... | 250/440.11 |

* cited by examiner

*Primary Examiner*—John R. Lee
*Assistant Examiner*—David A Vanore
(74) *Attorney, Agent, or Firm*—Webb Ziesenheim Logsdon Orkin & Hanson, P.C.

(57) ABSTRACT

A specimen holder support device for use with an electron microscope. The specimen holder support device alleviates atmospheric pressure (back pressure) applied via a specimen holder to a holder inner end-positioning drive mechanism for placing the inner end of a specimen holder in position. The specimen holder has a guide pin. The specimen holder support device comprises a holder mounting member, a slider, a slider-arresting member, and a spring, together with the holder inner end-positioning drive mechanism. The holder mounting member is formed at the outer end of a swinging member so as to extend axially, and has a slider-receiving hole into which the guide pin of the specimen holder protrudes. The holder inner end-positioning drive mechanism abuts against the specimen holding portion of the specimen holder and moves the specimen holding portion axially, thus placing the specimen holding portion in position. The slider has a pin engagement portion and an arrested portion for movement limitation. The pin engagement portion is received in the slider-receiving groove and engages the guide pin. The slider-arresting member has a slider-arresting portion for arresting the arrested portion from the side of the inner end. The spring biases the slider-arresting member to limit movement of the slider toward the inner end.

7 Claims, 13 Drawing Sheets

US 6,469,309 B1

VACUUM SEALED SPECIMEN HOLDER SUPPORT WITH MOTION DAMPING MEANS

BACKGROUND OF THE INVENTION

1. Field of the Invention

The present invention relates to a device for supporting a specimen holder used in an electron microscope.

The specimen holder extends through the outer wall member of the electron microscope or other instrument whose interior is maintained as a vacuum. The specimen holder is slidable inwardly and outwardly. Atmospheric pressure urges the specimen holder inward and applies pressure to a member bearing against the inner end of the specimen holder. The supporting device in accordance with the invention is used to alleviate the pressure applied to this member.

2. Description of the Related Art

The aforementioned device for supporting the specimen holder is known as shown in FIGS. 13 and 14. FIG. 13 is a schematic cross-sectional view of this known supporting device. FIG. 14 is a cross-sectional view taken on line XIV—XIV of FIG. 13.

For ease of understanding of the following description, the forward and rearward direction is taken as the X direction. The horizontal direction is taken as the Y direction. The vertical direction is taken as the Z direction. The direction indicated by the arrow X is the forward direction. The direction indicated by the arrow −X is the backward direction. The direction indicated by the arrow Y is the rightward direction. The direction indicated by the arrow −Y is the leftward direction. The direction indicated by the arrow Z is the upward direction.

The direction indicated by the arrow −Z is the downward direction.

The direction indicated by symbol $\hat{\ }$ is a direction directed from the rear side of the plane of the page to the front side. The direction indicated by symbol $\hat{x}$ is a direction directed from the front side of the plane of the page to the rear side.

In FIGS. 13 and 14, the microscope column of an electron microscope is generally indicated by 01 and has a yoke 02 made of a magnetic material and a substantially cylindrical goniostage Gs made of a nonmagnetic material. The yoke 02 has a cylindrical outer surface. The goniostage Gs is held inside the yoke 02. The yoke 02 forms a part of the outer wall of the microscope column 01.

Referring next to FIG. 14, the yoke 02 supports an excitation coil 04, a top magnetic polepiece 06 of an electron lens, and a bottom magnetic polepiece 07 of the electron lens. The polepieces have electron passage holes, respectively. A specimen chamber A is formed between the magnetic polepieces 06 and 07 of the electron lens inside the gonistage Gs.

The yoke 02 and the goniostage Gs are provided with goniometer-receiving holes 02a and Gs1, respectively, on the −X side as viewed in FIGS. 13 and 14. The holes 02a and Gs1 place the outside of the yoke 02 in communication with the specimen chamber A. The yoke 02 and the goniostage Gs are formed with positioning member-receiving holes 02b and Gs2, respectively, on the X side as viewed in FIGS. 13 and 14. The holes 02b and Gs2 place the outside of the yoke 02 in communication with the specimen chamber A.

A goniometer Gm is mounted in the goniometer-receiving holes 02a and Gs1, and supports a specimen holder H extending from outside the yoke 02 into the inside specimen chamber A.

The specimen holder H has a holder grip H1 at its outer end to permit an operator to operate the specimen holder. The holder H has an elongated specimen-holding portion H2 at its inner end. The specimen holder H is provided with an O-ring groove in which an O-ring H3 is accommodated. A guide pin H4 (see FIG. 14) is mounted on the outer surface of the specimen holder H.

The goniometer Gm has a cylindrical bearing 08 and a cylindrical support member 09 fixedly mounted in the goniometer-receiving holes 02a and Gs1, respectively. A spherical bearing 09a is formed at the inner end of the support member 09. The cylindrical bearing 08 has a cylindrical inner surface on which bearings 011 are mounted. The cylindrical bearing 08 is so disposed that the axis of its cylindrical inner surface extends horizontally and passes through the center O of the spherical surface of the support member 09.

The goniometer Gm has a rotatable member 012 and a holder mounting member 013. The rotatable member 012 is held by the bearings 011 so as to be angularly adjustable around the X-axis.

The holder mounting member 013 is provided with a hole 013a extending therethrough to hold the specimen holder H. The outer surface of the inner end of the holder mounting member 013 forms a spherical surface 013b. The holder mounting member 013 is held by the spherical bearing 09a so as to be angularly adjustable around the center O of the spherical surface. The hole 013a extending through the holder is coincident with the X-axis at a reference position.

Referring to FIG. 14, a Z-direction positioning drive mechanism (hereinafter referred to as the Z-positioning drive mechanism) Dz is mounted at the bottom of the outer-end portion (on the −X side) of the rotatable member 012. If the holder mounting member 013 is rotated in the Z direction by the Z-positioning drive mechanism Dz, the position of the inner end of the specimen holder H in the Z direction can be adjusted.

Referring to FIG. 13, a Y-positioning drive mechanism Dy is mounted to a right-side portion of an outer-end portion (on the −X side) of the rotatable member 012. The position of the inner end of the specimen holder H in the Y direction can be adjusted with the Y-positioning drive mechanism Dy. The position of the inner end of the specimen holder H in the Y direction is detected by a Y-linear gauge Ly in contact with the outer surface of the holder mounting member 013.

In FIGS. 13 and 14, a positioning drive mechanism support member 016 is fitly mounted in the positioning member-receiving hole 02b formed on the X side of the yoke 02 and goniostage Gs. A slider-receiving hole 016a and a lever-receiving hole 016b lying on the X-axis are formed in the positioning drive mechanism support member 016. A holder inner end-positioning drive mechanism Dx (see FIG. 14) has a positioning slider 017 that is received in the slider-receiving hole 016a so as to be adjustable in the X direction.

Referring to FIG. 14, the holder inner end-positioning drive mechanism Dx has a lever 018, a lengthwise position-adjusting screw 019, and a lengthwise position-adjusting motor 021.

In FIGS. 13 and 14, the lever 018 is held in the lever-receiving hole 016b formed in the positioning drive mechanism support member 016 so as to be rotatable about the Y-axis. One end of the lever 018 abuts against the outer end (on the X side) of the positioning slider 017. The other end of the lever 018 abuts against the front end (on the −X side) of the lengthwise position-adjusting screw 019. As shown in FIG. 14, as the lengthwise position-adjusting motor 021 is rotated, the lengthwise position-adjusting screw 019 is moved forward or rearward via an output gear 022 and via a gear 023 of the holder inner end-positioning drive mechanism Dx, thus moving the end of the lever 018 in the X direction.

A member 024 for placing the inner end of the holder inner end-positioning drive mechanism Dx in position is located in the positioning member-receiving hole Gs2 formed in the goniostage Gs. The inner end of the specimen holder H and the inner end of the positioning slider 017 bear against the inner end-positioning member 024. This inner end-positioning member 024 determines the position of the inner end (on the X side) of the specimen holder H. and is held by the goniostage Gs so as to be movable within a quite narrow range. The amount of movement of the specimen holder H in the X direction is detected via the inner end-positioning member 024 and via the lever 018 by an X-linear gauge Lx (see FIG. 14) in contact with one end of the lever 018.

With the prior art technique described above, the specimen-holding portion H2 at the inner end of the specimen holder H is urged to bear against the holder inner end-positioning drive mechanism Dx by atmospheric pressure (back pressure), the drive mechanism Dx being on a vacuum side. Thus, pressure is applied to the holder inner end-positioning drive mechanism Dx.

Because of this pressure, force tends to stay in the components of the holder inner end-positioning drive mechanism Dx if there is slight resilient deformation or displacement. Therefore, the specimen-holding portion H2 of the specimen holder H tends to creep during observation, causing "after drift" of the specimen held on the specimen-holding portion H2 during observation.

With the prior art technique described above, the amount of movement of the specimen holder H in the X direction is detected via the holder inner end-positioning drive mechanism Dx in which force tends to stay as described above. Therefore, the detection accuracy is poor. Especially, the member 024 for placing the inner end of the holder inner end drive mechanism Dx in position is held by a spring, and is displaced according to displacement of the specimen-holding portion H2. Consequently, the position detection accuracy in the X direction tends to deteriorate.

SUMMARY OF THE INVENTION

It is an object of the present invention to provide a specimen holder support device acting to support a specimen holder extending through an outer wall forming a chamber maintained as a vacuum such that the specimen holder is slidable, the specimen holder support device having a holder inner end-positioning drive mechanism for placing the inner end of the specimen holder in position, the specimen holder support device being characterized in that pressure applied to the holder inner end-positioning drive mechanism by atmospheric pressure (back pressure) via the specimen holder is alleviated. The specimen holder support device is further characterized in that the position of the specimen holder in the axial direction is detected accurately.

This object is achieved in accordance with the teachings of the present invention by a specimen holder support device that is for use with an electron microscope having a specimen chamber defined by a wall, the specimen holder support device comprising a cylindrical support member extending through the wall of the chamber and mounted to this wall, a swinging member inserted in the support member, a specimen holder slidably mounted in the swinging member via an O-ring, and an X-motion drive mechanism engaging the front end of the specimen holder. A spherical bearing is formed on the inner surface of the support member. The swinging member can swing about the spherical bearing in the Y- and Z directions. This specimen holder support device is characterized in that there is provided a holder movement-limiting means for reducing force applied to the X-motion drive mechanism from the specimen holder.

Other objects and features of the invention will appear in the course of the description thereof, which follows.

DESCRIPTION OF THE PREFERRED EMBODIMENTS

The preferred embodiments of the present invention are hereinafter described with reference to the accompanying drawings. It is to be understood that the invention is not limited thereto.

Figure 1:
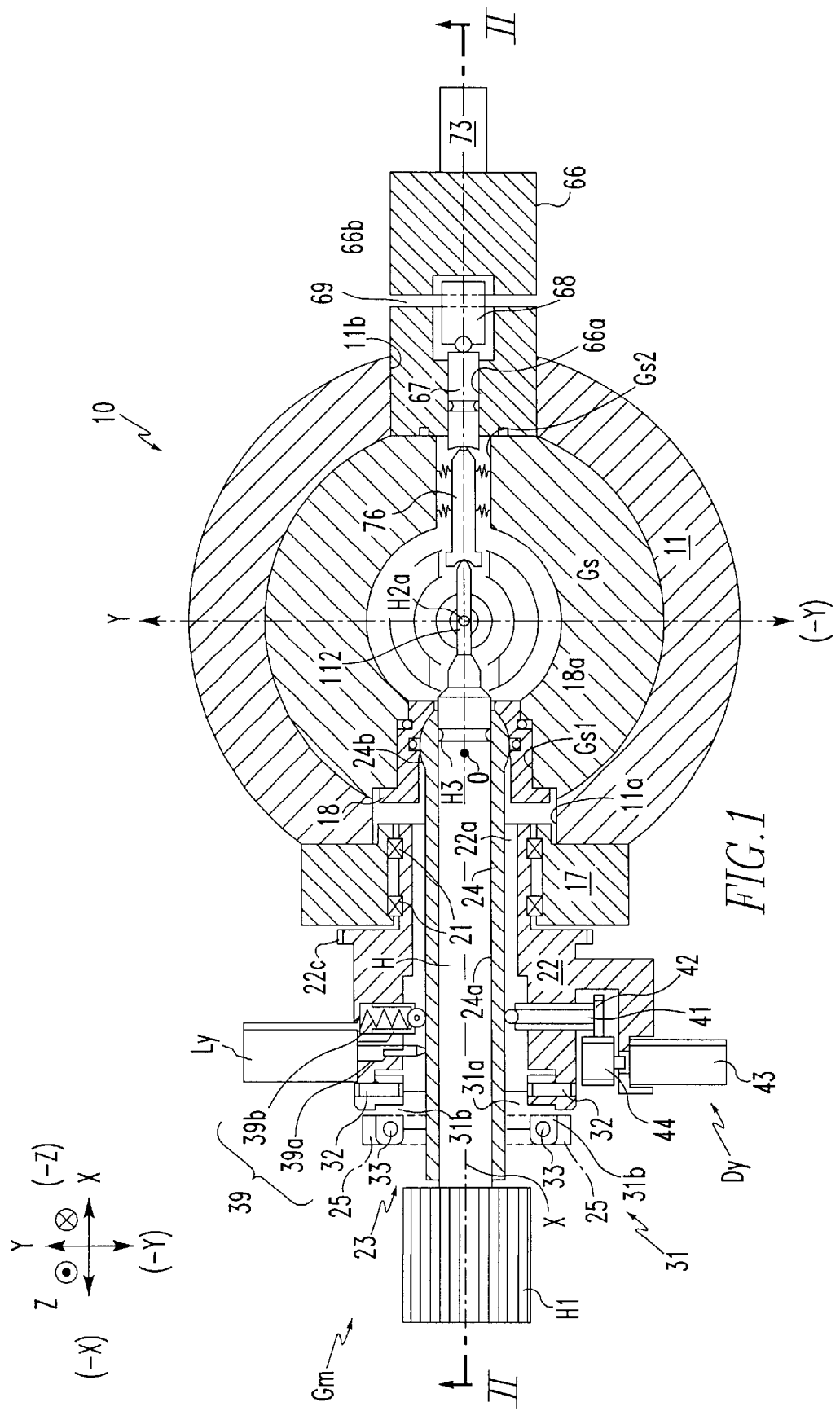
FIG. 1 is a vertical cross section of a specimen holder support device in accordance with an embodiment of the present invention.
Figure 2:
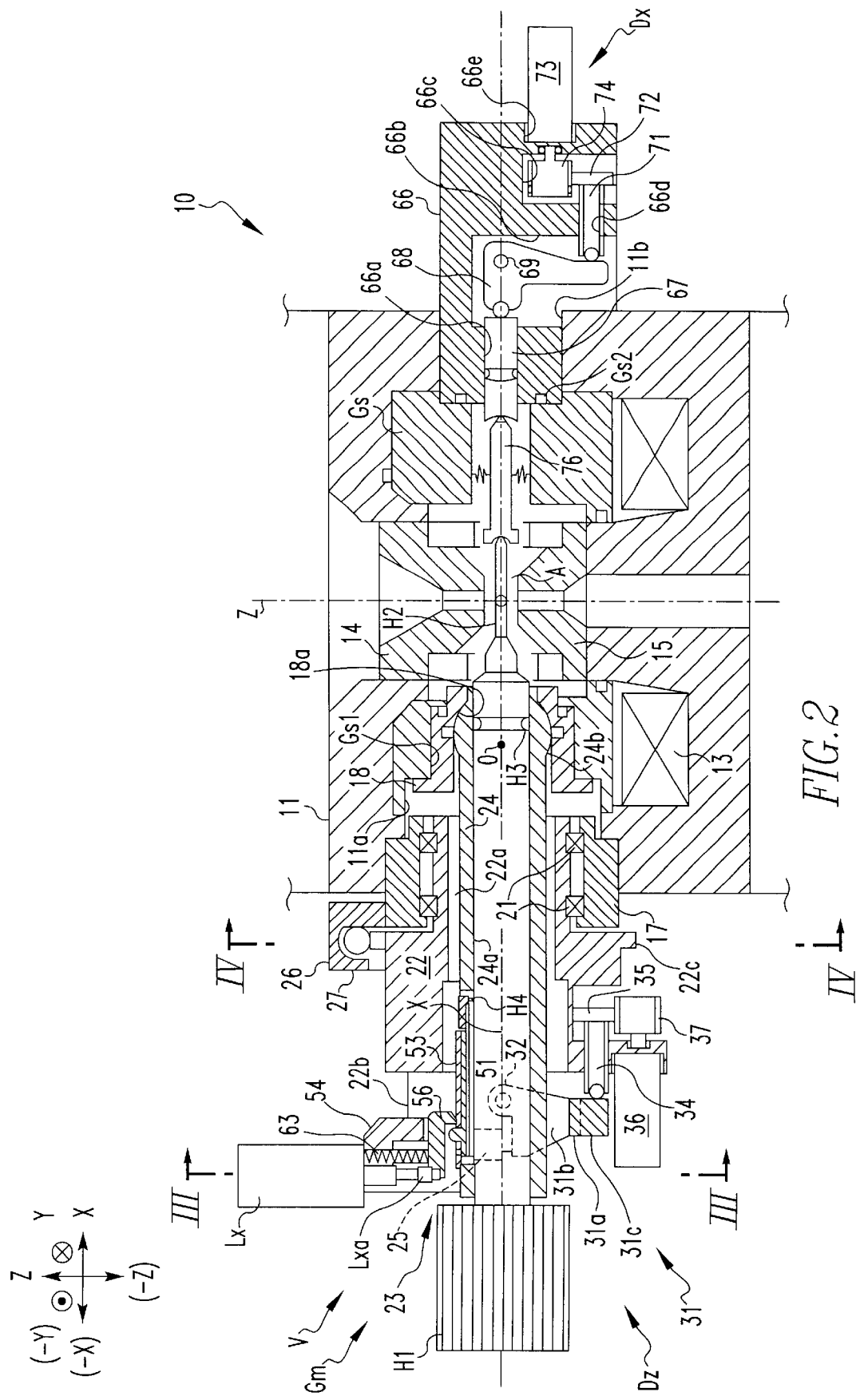
FIG. 2 is a cross-sectional view taken on line II—II of FIG. 1.
Figure 3:
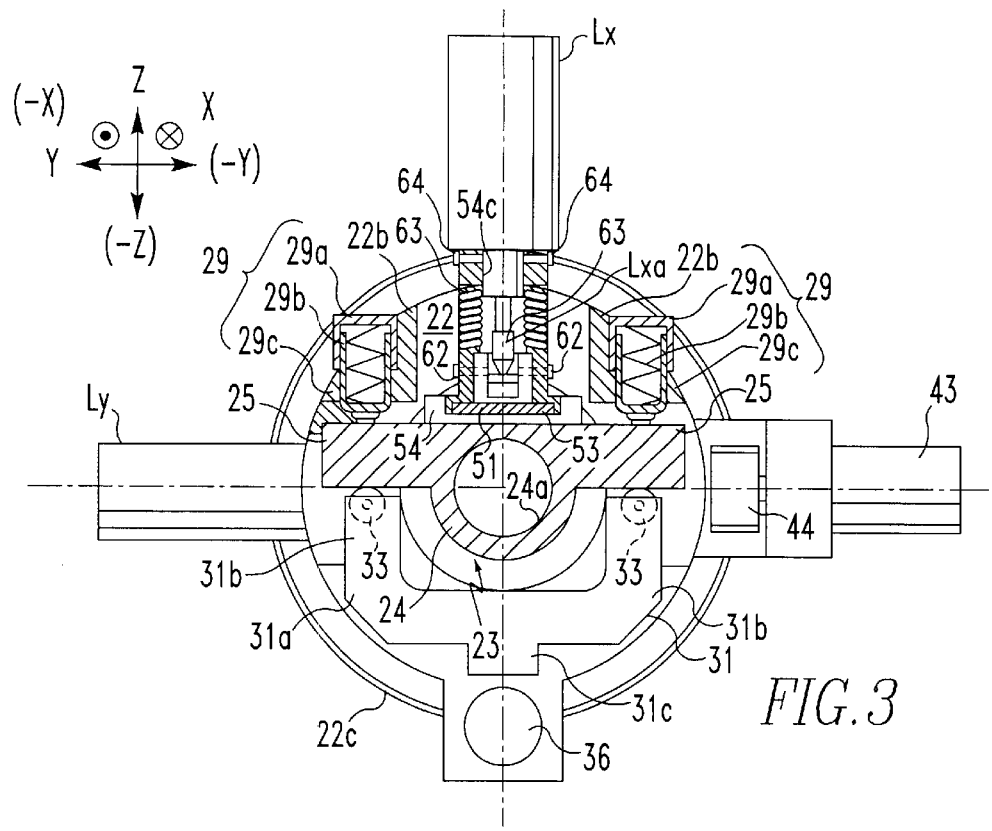
FIG. 3 is a cross-sectional view taken on line III—III of FIG. 2.
Figure 4:
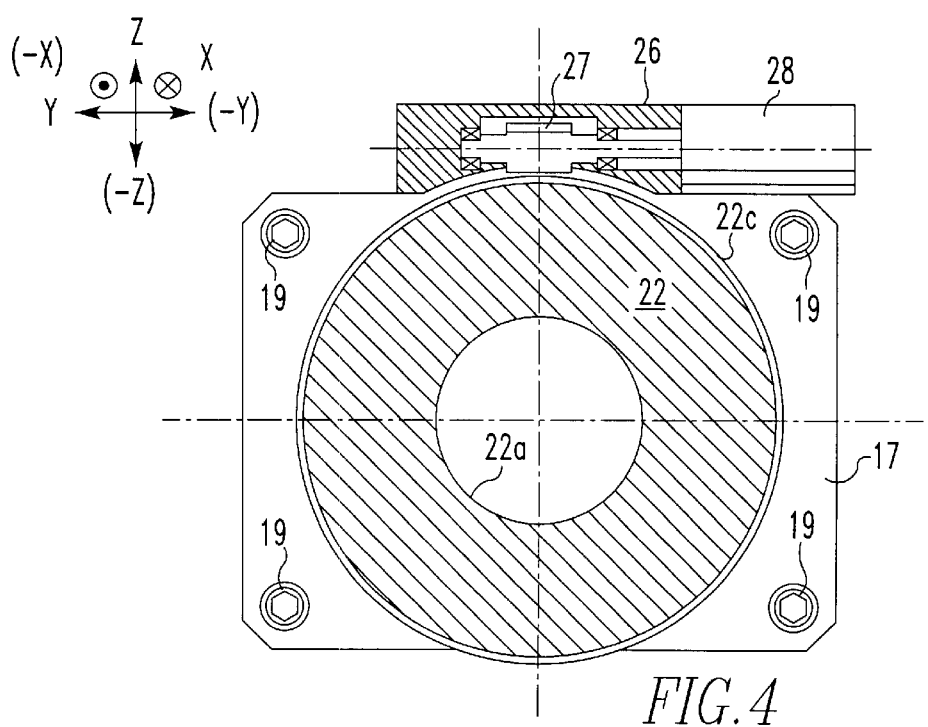
FIG. 4 is a cross-sectional view taken on line IV—IV of FIG. 2.
Figure 5:
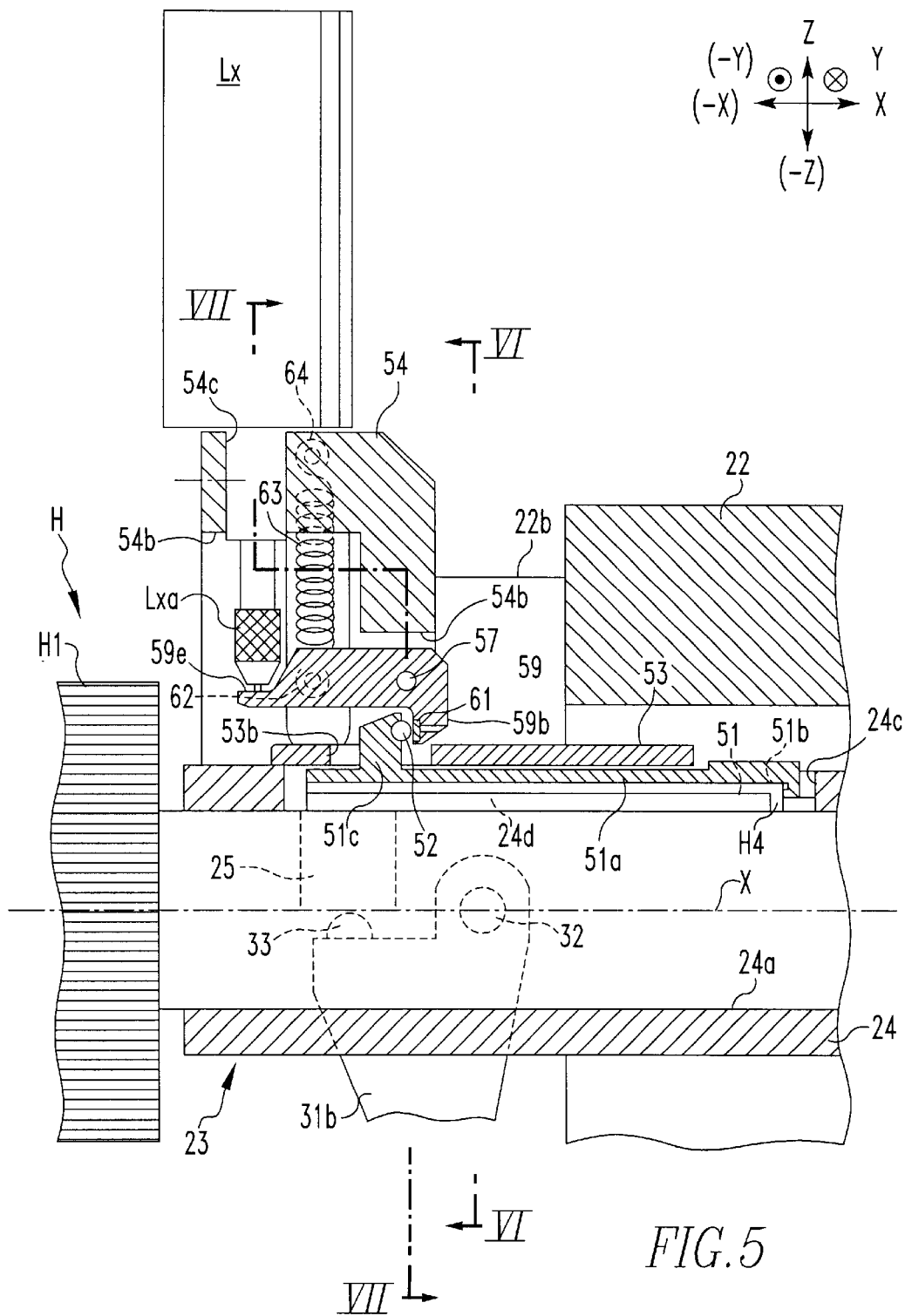
FIG. 5 is an enlarged view of the portion of the specimen holder support member which is indicated by the arrow V of FIG. 2.
Figure 6:
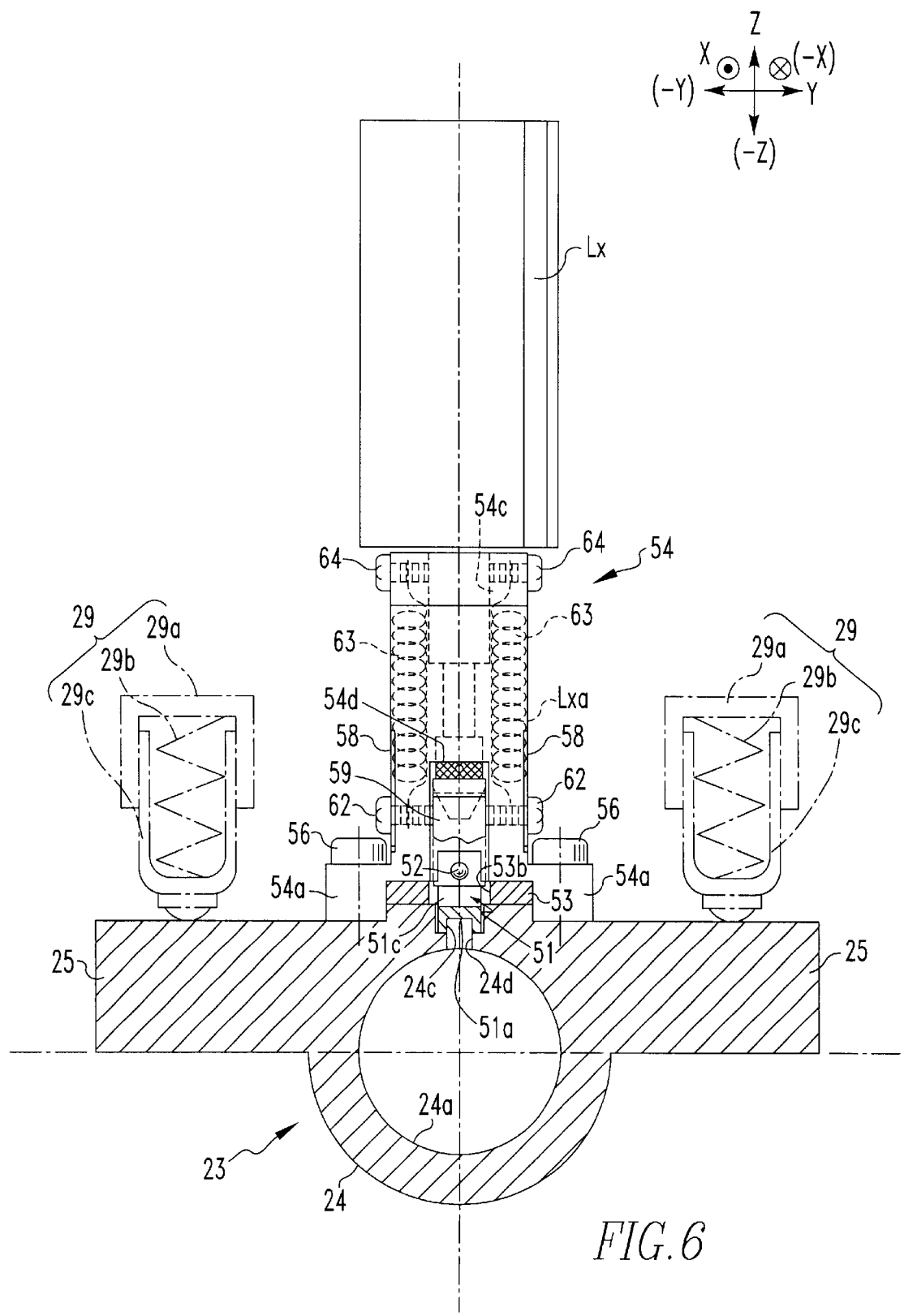
FIG. 6 is a view taken along line VI—VI of FIG. 5.
Figure 7:
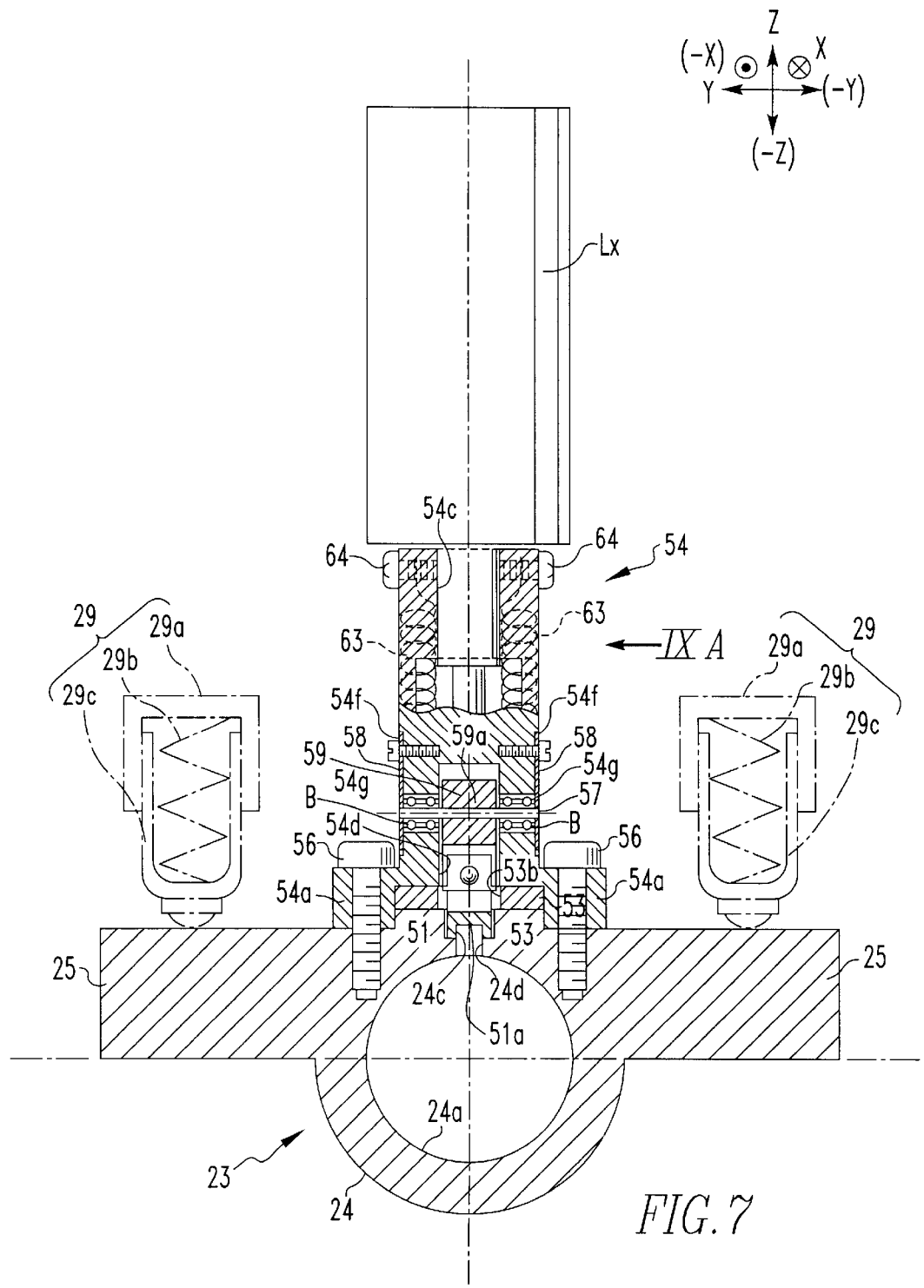
FIG. 7 is a view taken along line VII—VII of FIG. 5.
Figure 8:
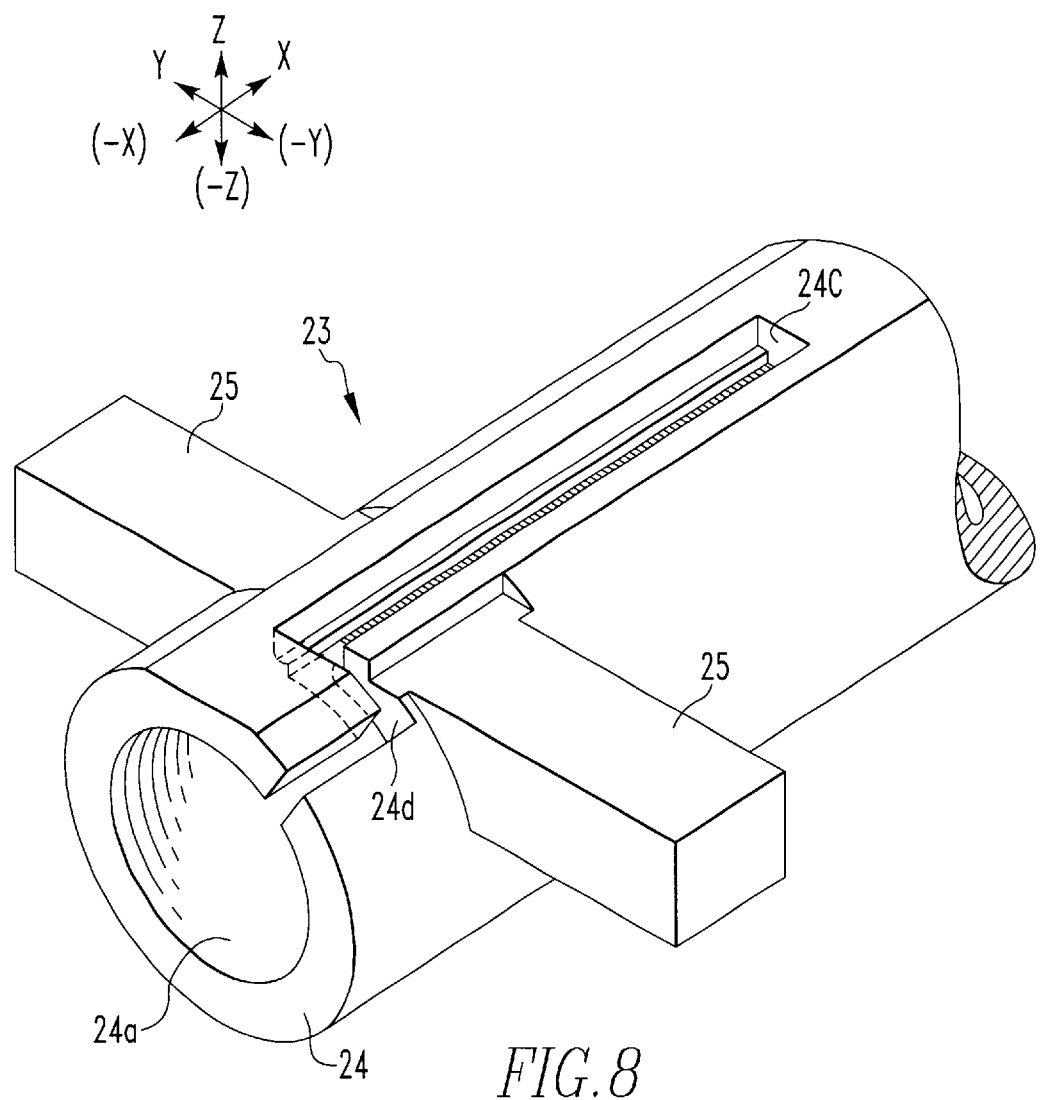
FIG. 8 is a perspective view of a pin guide groove formed in an outer-end portion of a holder mounting member of the specimen holder support device.

FIG. 1 is a vertical cross section of a specimen holder support device in accordance with one embodiment of the present invention. FIG. 2 is a cross-sectional view taken on line II—II of FIG. 1. FIG. 3 is a cross-sectional view taken on line III—III of FIG. 2. FIG. 4 is a cross-sectional view taken on line IV—IV of FIG. 2. FIG. 5 is an enlarged view of a main portion of the specimen holder support device indicated by the arrow V of FIG. 2. FIG. 6 is a view taken along line VI—VI of FIG. 5. FIG. 7 is a view taken along line VII—VII of FIG. 5. FIG. 8 is a perspective view of a pin guide groove formed in an outer-end portion of a holder mounting member of the specimen holder support device.

In FIGS. 1 and 2, an electron microscope has a microscope column 10 that has a yoke 11 made of a magnetic material and a substantially cylindrical goniostage Gs made of a nonmagnetic material. The yoke 11 has a cylindrical outer surface. The goniostage Gs is held to the inner surface of the yoke 11, which forms a part of the outer wall of the microscope column 10 of the microscope.

As shown in FIG. 2, the yoke 11 supports top and bottom magnetic polepieces 14 and 15, respectively, of an electron lens, together with an excitation coil 13 (FIG. 2). The magnetic polepieces have electron beam passage holes. A specimen chamber A maintained as a vacuum is formed between the magnetic polepieces 14 and 15 and inside the goniostage Gs.

In FIGS. 1 and 2, the goniometer-receiving holes 11a and Gs1 are formed in a rear portion (on the -x side) of the yoke 11 and in a rear portion of the goniostage Gs, respectively, to place the outside of the yoke 11 in communication with the specimen chamber A. Also, holder front end-positioning mechanism-receiving holes 11b and Gs2 are formed in a front portion (on the X side) of the yoke 11 and a front-side portion of the goniostage Gs, respectively, to place the outside of the yoke 11 in communication with the specimen chamber A.

A cylindrical bearing 17 and a cylindrical support member 18 are positioned in the goniometer-receiving holes 11a and Gs1, respectively. A spherical bearing 18a is formed at the inner end of the support member 18, which in turn is mounted on the goniostage Gs that is a part of the specimen chamber wall.

The cylindrical bearing 17 is so arranged that the axis of the cylindrical inner surface extends horizontally and passes through the center O of the spherical surface of the support member 18. The cylindrical bearing 17 is mounted to the yoke 11 by bolts 19 (FIG. 4), and has a cylindrical inner surface on which bearings 21 are mounted.

Referring to FIGS. 1 and 2, a goniometer Gm is mounted on the cylindrical bearing 17. This goniometer Gm is a member for supporting a specimen holder H extending from outside the yoke 11 into the specimen chamber A.

The specimen holder H has a holder grip H1 at its outer end. The holder grip H1 can be manually operated. The holder H has an elongated specimen holding portion H2 around its inner end. The specimen holding portion H2 has an accommodation portion H2a (FIG. 1) for accommodating a specimen (not shown). An O-ring groove for receiving an O-ring H3 is formed in the specimen holder H. A guide pin H4 (FIGS. 2 and 5) is mounted on a portion of the specimen holder H that is closer to the holder grip H1.

Referring to FIGS. 1 and 2, the aforementioned goniometer Gm has a substantially cylindrical rotating member 22 and a holder mounting member 23. The rotating member 22 is held by the bearings 21 so as to be angularly adjustable about the X-axis. The holder mounting member 23 is held so as to be angularly adjustable about the center O of the spherical surface described above. The holder mounting member 23 has a cylindrical swinging member 24 and protruding portions 25 (FIG. 3) that protrude right and left (in the Y direction) from the rear end (on the -X side) of the swinging member 24.

The rotating member 22 is provided with a hole 22a (FIGS. 1 and 2) through which the holder mounting member extends. The rotating member 22 has a rear-end portion having a pair of rearwardly extending top surface-pushing member support portions 22b (FIGS. 2 and 3) that are spaced from each other horizontally.

The rotating member 22 held by the bearings 21 so as to be rotatable about the X-axis has a toothed wheel 22c (FIGS. 1, 2, and 4) on its outer surface. In FIGS. 2 and 4, a gear holder 26 is mounted on the top end of the cylindrical bearing 17. A worm gear 27 (FIG. 4) in mesh with the toothed wheel 22c of the rotating member 22 is rotatably held on the gear holder 26. The worm gear 27 is rotationally driven around the X-axis by an electric motor 28 (FIG. 4) connected to the outer end of a shaft extending through the gear holder 26, the motor 28 being used for driving around the X-axis. Therefore, the angular position of the rotating member 22 around the X-axis can be adjusted by rotationally driving the motor 28 around the X-axis.

In FIGS. 1 and 2, a holder-receiving hole 24a is formed in the swinging member 24 of the holder mounting member 23. A spherical surface 24b is formed on the outer surface of an inner-end portion of the swinging member 24, which in turn is inserted in the support member 18. The spherical surface 24b abuts against the spherical bearing 18a of the support member 18. The swinging member 24 can swing about the spherical bearing 18a in the Y and Z directions. The holder-receiving hole 24a holds the specimen holder H, which is swingably mounted in the swinging member 24 via the O-ring H3 described above. In the reference position, the axis of the holder-receiving hole 24a is coincident with the X-axis. However, when the holder mounting member 23 is rotated about the center O of the spherical surface to adjust the position of the specimen held to the front end of the specimen holder H within the specimen chamber A, the axis of the holder-receiving hole 24a is no longer coincident with the X-axis.

In FIGS. 5 and 8, the top surface of an outer-end portion of the swinging member 24 is ground flat. A slider-receiving groove 24c is formed in this flat ground portion of the swinging member 24. As shown in FIG. 8, a pin guide groove 24d narrower than the slider-receiving groove 24c is formed 4d under this groove 24c. The pin guide groove 24d is cranked 4d up to the outer end of the swinging member 24. When the specimen holder H is mounted to the holder mounting member 23, the guide pin H4 on the specimen holder H moves through the slide-receiving groove 24c. At this time, as shown in FIG. 5, the head of the guide pin H4 protrudes into the pin guide groove 24d.

As shown in FIGS. 1 and 3, the top surfaces of the protruding portions 25 of the holder mounting member 23 are made flat. As shown in FIG. 3, a top surface-pushing member 29 that pushes the top surfaces of the protruding portions 25 has a spring-receiving member 29a mounted to the rear ends (on the -X side) of a pair of top surface-pushing member support portions 22b of the rotating member 22. The top surface-pushing member 29 has a push spring 29b and a vertically movable abutting member 29c that are received in the spring-receiving member 29a. The push spring 29b pushes the abutting member 29c against the top surfaces of the protruding portions 25 of the holder mounting member 23.

A movable member 31 shown in FIGS. 2 and 3 has a portion 31a (FIG. 3) extending horizontally (in the Y direction) and upwardly protruding portions 31b formed at both ends of the horizontally extending portion 1a. The top ends of the upwardly protruding portions 31b are held by horizontally spaced shafts 32 (FIGS. 1 and 5), respectively, so as to be swingable back and forth. The shafts 32 are held by the rotating member 22. Sphere support surfaces that support balls 33 (FIGS. 3 and 5) bearing against the bottom surfaces, respectively, of the protruding portions 25 of the holder mounting member 23 are formed in the upwardly protruding portions 31b, respectively. A downwardly protruding portion 31c (FIGS. 2 and 3) is formed in the center of the horizontal portion 31a of the movable member 31.

Referring to FIG. 2, a vertical movement adjusting screw 34 is located opposite to the front side surface (on the X side) of the downwardly protruding portion 31c of the movable member 31 and held by the rotating member 22. A toothed wheel 35 is rigidly mounted to the front end (on the X side) of the vertical movement adjusting screw 34 and in mesh with the output gear 37 of a vertical rotation motor 36 held to the rotating member 22.

Accordingly, if the vertical rotation motor 36 is rotated forward or rearward, the vertical movement adjusting screw 34 is rotated via the output gear 37 and the toothed wheel 35. Depending on the direction of rotation, the vertical movement adjusting screw 34 moves toward or away from the downwardly protruding member 31c. Since the front end of the vertical movement adjusting screw 34 bears against the downwardly protruding portion 31c of the movable member 31 (FIG. 2), if the vertical movement adjusting screw 34 moves toward or away from the member 31c, the movable member 31 swings about the shaft 32. At this time, the push spring 29b of the top surface-pushing member 29 is compressed or elongated. The holder mounting member 23 is designed to rotate vertically within a narrow angular range of 4 to 5° about the center O of the spherical surface.

A Z-positioning drive mechanism Dz is made up of the components 31–37 described above. The Z-positioning drive mechanism Dz and the top surface-pushing member 29 cooperate to place the holding mounting member 23 in position vertically around the center O of the spherical surface.

In FIG. 1, a bearing member 39a held by the rotating member 22 so as to be movable horizontally is pushed against the right side surface (on the Y side) of the rear portion (on the −X side) of the swinging member 24 of the holder mounting member 23 by a push spring 39b. The bearing member 39a and the push spring 39b form a horizontal pushing member 39 for determining the angular position of the holder mounting member 23 around the center O of the spherical surface in the Y direction (i.e., in the horizontal direction).

In FIG. 1, a horizontal movement adjusting screw 41 is supported by the rotating member 22 in an opposite relation to the side surface of the holder mounting member 23 that faces away from the surface abutting against the bearing member 39a. Rotating force from the horizontal rotation motor 43 is applied to the horizontal movement adjusting screw 41 via the gear 42 at the left end of the screw 41 and via the output gear 44 of the horizontal movement motor 43 held to the rotating member 22, in the same way as the vertical movement adjusting screw 34. Depending on the direction of rotation of the horizontal movement adjusting screw 41, the horizontal movement adjusting screw 41 moves toward or away from the holder mounting member 23. Because the front end of the screw 41 abuts against the left side surface (on the −Y side) of the holder mounting member 23, if the horizontal movement adjusting screw 41 moves toward or away from the holder mounting member, the push spring 39b of the horizontal pushing member 39 is compressed or stretched. The holder mounting member 23 is designed to rotate right or left within a narrow angular range of 5 to 6 degrees about the center O of the spherical surface.

The position of the inner end of the specimen holder H in the Y direction is adjusted by horizontal movement of the holder mounting member 23. The amount of movement of the inner end of the specimen holder H in the Y direction is measured by a Y-linear gauge Ly in contact with the swinging member 24 of the holder mounting member 23. A Y-positioning drive mechanism Dy is made up of the components 41–44 described above.

Figure 9A:
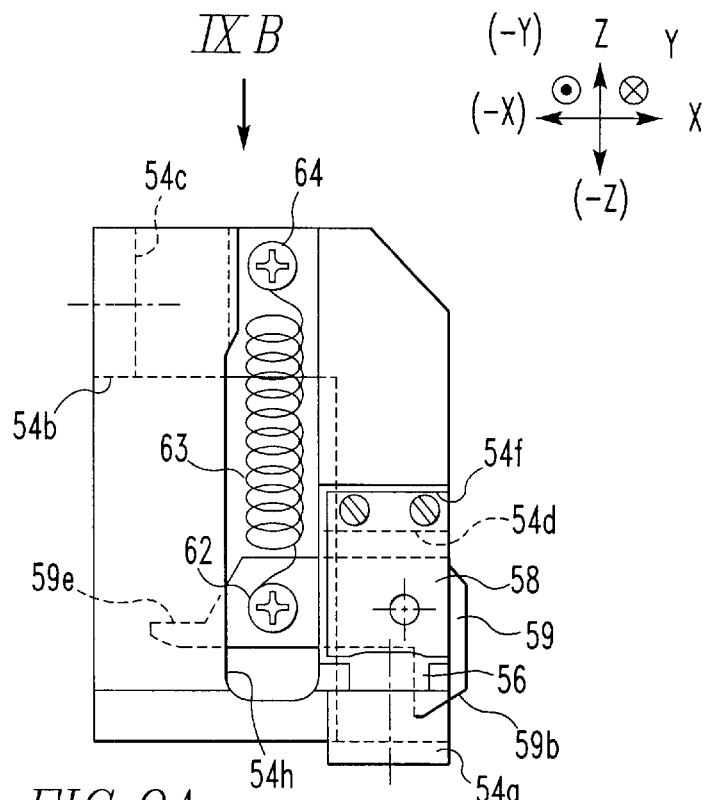
FIG. 9A is a lever support member of the specimen holder support device, as viewed from the direction indicated by the arrow IXA of FIG. 7.
Figure 9B:
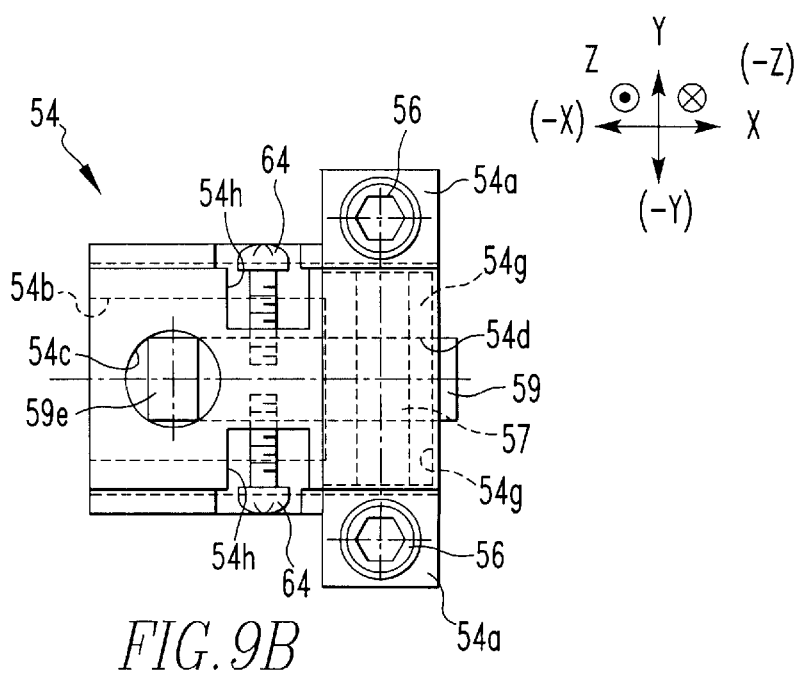
FIG. 9B is a view taken along the arrow IXB of FIG. 9A.
Figure 10A:
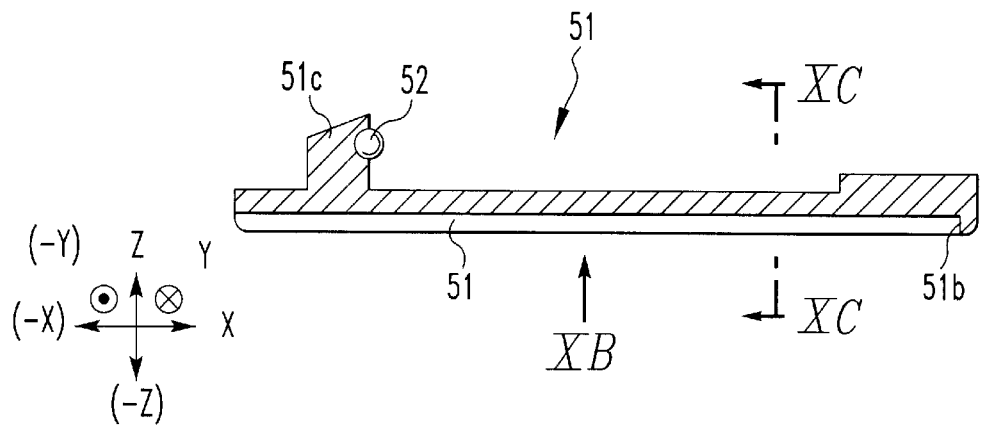
FIG. 10A is a vertical cross section of a slider used in the specimen holder support device in accordance with the invention.
Figure 10B:
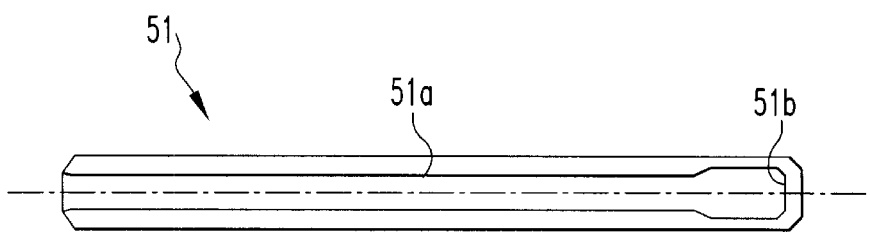
FIG. 10B is a view taken from the direction indicated by the arrow XB of FIG. 10A.
Figure 10C:
FIG. 10C is a vertical cross section taken on line XC—XC of FIG. 10A.
Figure 10C:
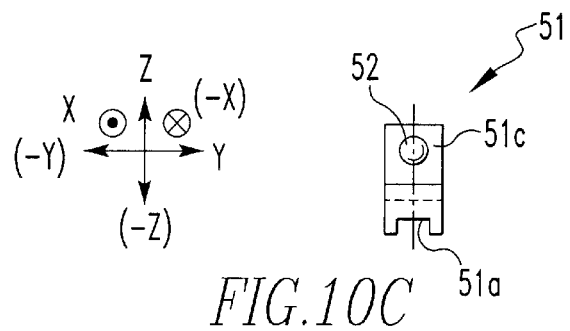
Figure 11A:
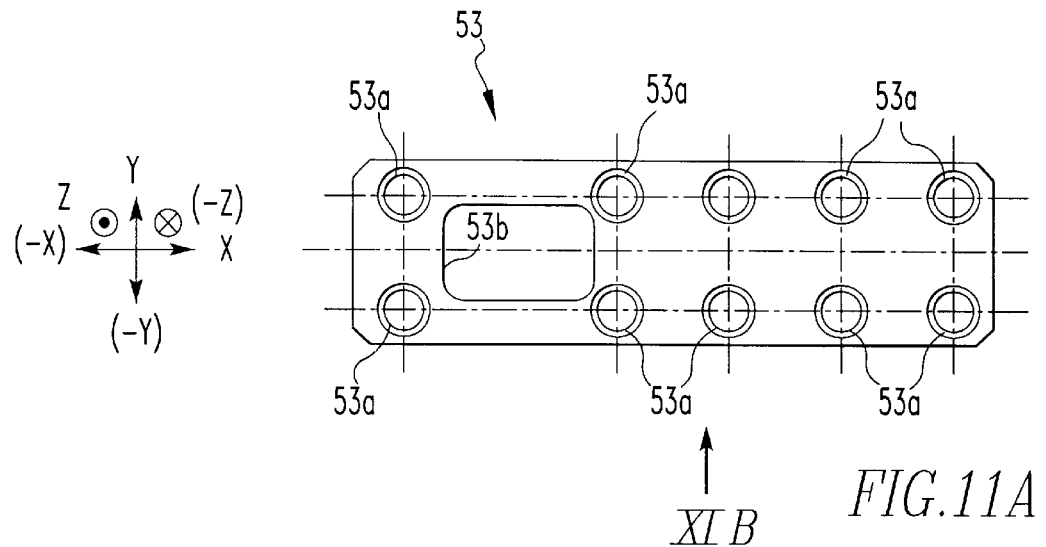
FIG. 11A is a plan view of a slider-holding plate held in a slider-receiving groove formed in the holder mounting member.
Figure 11B:
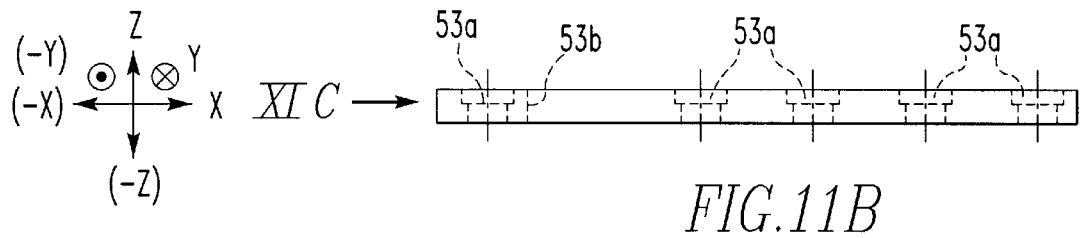
FIG. 11B is a view taken along the direction indicated by the arrow XIB of FIG. 11A.
Figure 11C:
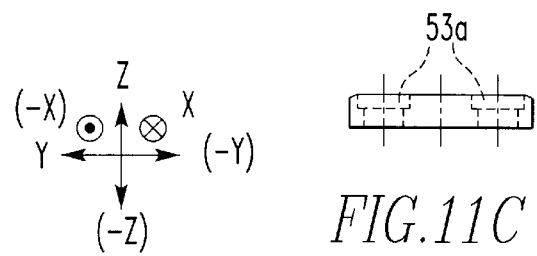
FIG. 11C is a view taken along the direction indicated by the arrow XIC of FIG. 11B.
Figure 12A:
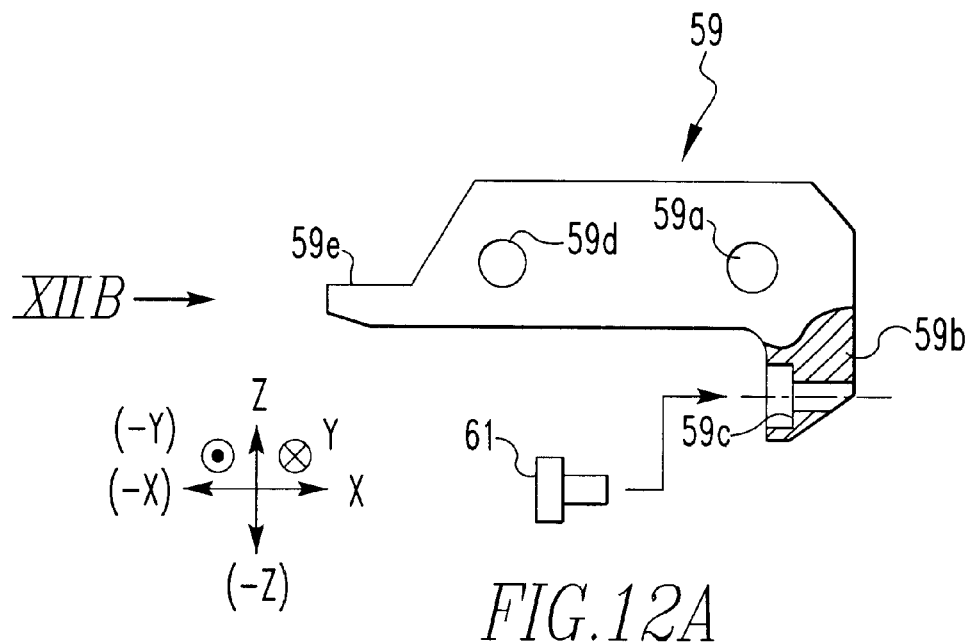
FIG. 12A is a partially cross sectional view of a lever that is a slider-arresting member of the specimen holder support member.
Figure 12B:
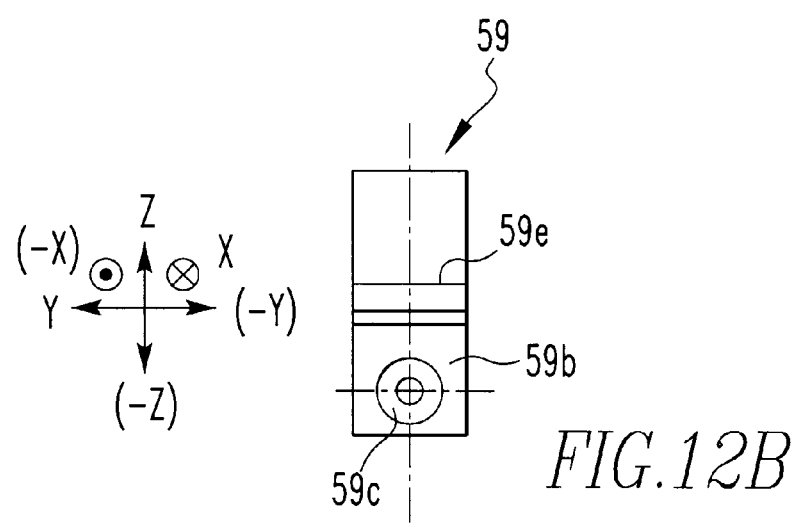
FIG. 12B is a view taken along the direction indicated by the arrow XIIB of FIG. 12A.
Figure 13:
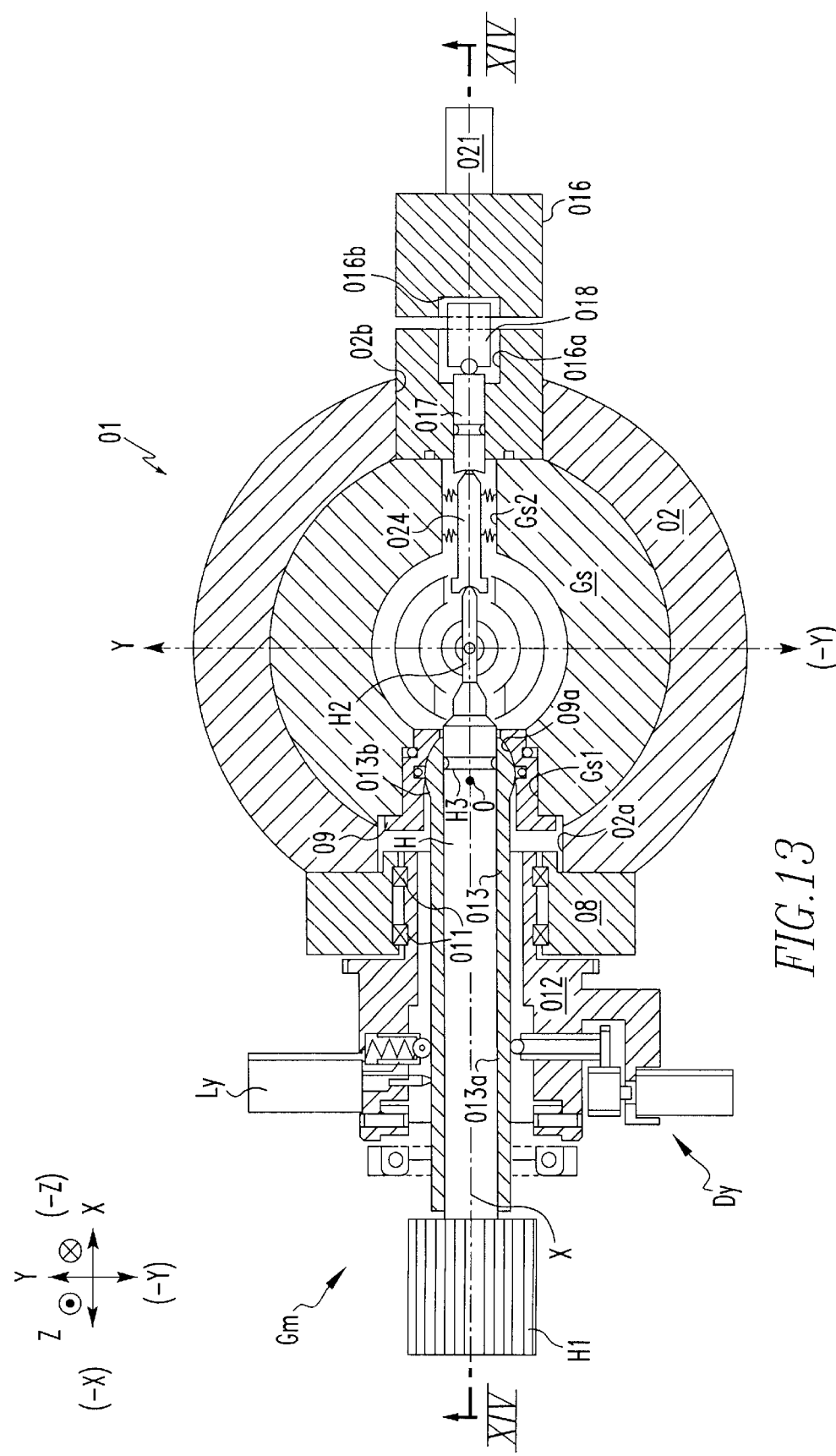
FIG. 13 is a schematic cross section of the prior art specimen holder support device.
Figure 14:
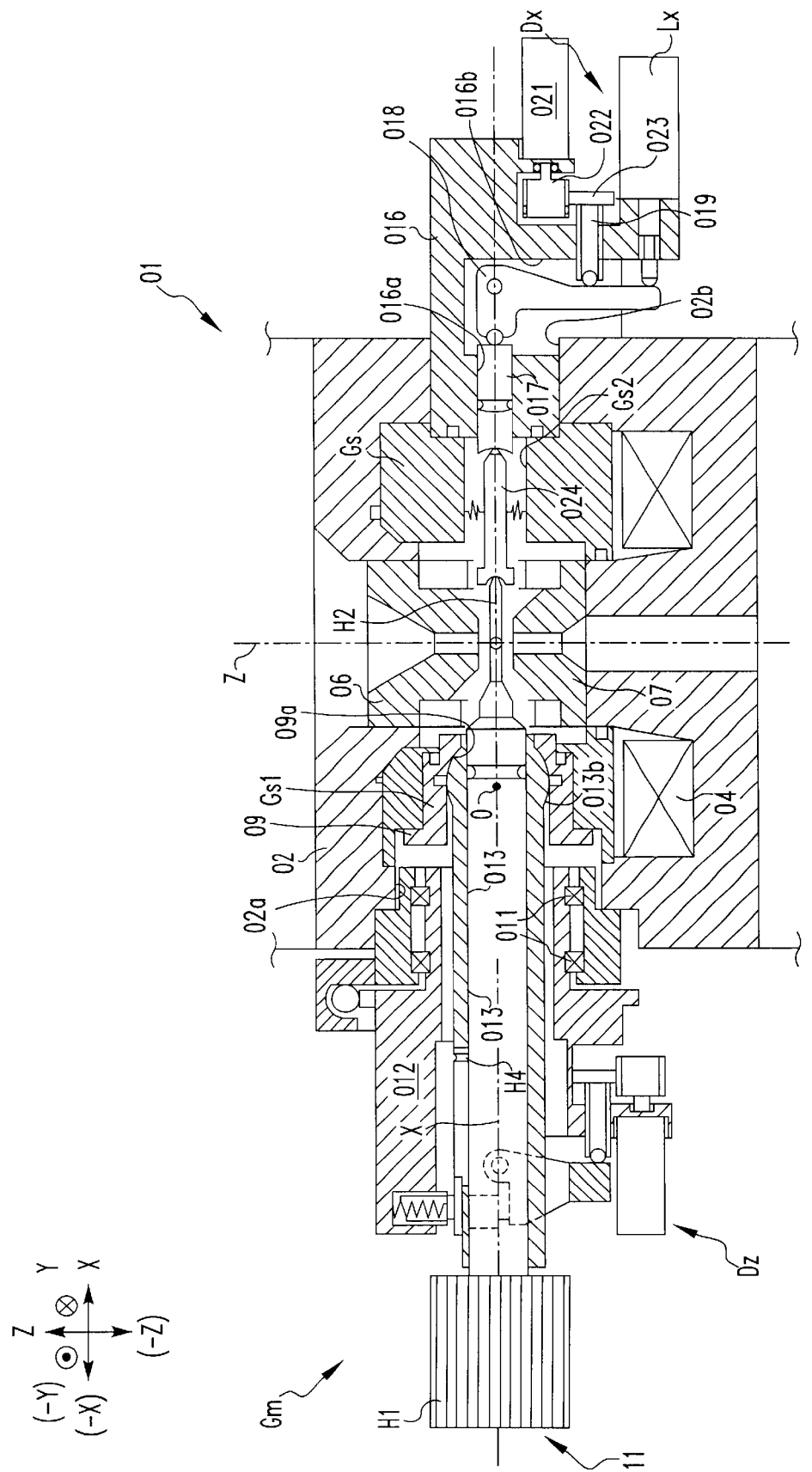
FIG. 14 is a cross-sectional view taken on line XIV—XIV of FIG. 13.

FIGS. 9A and 9B illustrate a lever support member for a specimen holder support device in accordance with the present invention. FIG. 9A is a view taken from the direction indicated by the arrow IXA of FIG. 7. FIG. 9B is a view taken from the direction indicated by the arrow IXB of FIG. 9A. FIGS. 10A–10C illustrate a slider used in this specimen holder support device in accordance with the invention. FIG. 10A is a vertical cross section of the slider. FIG. 10B is a view taken from the direction indicated by the arrow XB of FIG. 10A. FIG. 10C is a cross-sectional view taken along line XC—XC of FIG. 10A. FIGS. 11A–11C illustrate a slider holding plate for holding the slider in a slider-receiving groove. FIG. 11A is a plan view of the slider holding plate. FIG. 11b is a view taken from the direction indicated by the arrow XIB of FIG. 11A. FIG. 11C is a view taken from the direction indicated by the arrow XIC of FIG. 11B. FIGS. 12A and 12B illustrate a lever that is a slider-arresting member of the specimen holder support device. FIG. 12A is a partially cross-sectional view of the lever. FIG. 12B is a view taken along the direction indicated by the arrow XIIB of FIG. 12A.

In FIGS. 5 and 6, a slider 51 is received in the slider-receiving groove 24c formed in the holder mounting member 23 so as to be slidable longitudinally of the mounting member 23 (i.e., in the X direction).

In FIG. 10, a recess 51a extending in the X direction (forwardly and rearwardly) is formed in the bottom surface of the slider 51 received in the slider-receiving groove 24c (FIG. 5). The guide pin H4 of the specimen holder H can move in the recess 51a. A pin engagement portion 51b engaging with the guide pin H4 of the specimen holder H is formed on the front-end side (on the X side) of the recess 51a in the slider 51.

Referring to FIG. 10A, an arrested portion 51c for movement limitation is formed at the rear end (on the −X side) of the top surface of the slider 51. When received in the slider-receiving groove 24c in the swinging member 24 as shown in FIG. 5, the arrested portion 51c protrudes outwardly from the swinging member 24. A ball 52 is firmly mounted to the surface on the front side (on the inner side and on the X side) of the arrested portion 51c. In this embodiment, the ball 52 is made of steel. Instead, the ball 52 may be made of ruby.

In FIGS. 5 and 6, a slider-holding plate 53 that covers the top end of the slider-receiving groove 24c is screwed to a flat portion (see FIG. 8) of the slider-receiving groove 24c at the top surface of the swinging member 24.

In FIGS. 11(A)–(C), the slider-holding plate 53 is rectangular in shape and has plural fixing threaded holes 53a and a hole 53b formed near an outer end (on the −X side). The threaded holes 53a are arranged along the longer sides of the rectangular plate 53. The arrested portion 51c extends through the hole 53b.

The fixing threaded holes 53a permit the slider-holding plate 53 to be screwed to the swinging member 24 of the holder swinging member 23 to prevent side fringes of the slider-receiving groove 24d in the swinging member 24 from moving toward or away from each other circumferentially, the side fringes being spaced from each other horizontally (in the X direction).

As shown in FIGS. 5 and 6, the arrested portion 51c for limiting movement of the slider 51 received in the slider-receiving groove 24d extends through the hole 53b described above. The arrested portion 51c can move forwardly and rearwardly (in the X direction).

In FIGS. 3, 5–7, a lever support member 54 is located above the slider-receiving groove 24d in the swinging member 24.

In FIGS. 7 and 9, fixed portions 54a are formed on the front-end side (on the X side) at a lower portion of the lever support member 54. Lock bolts 56 (FIG. 7) screwed to the top portion of the protruding portions 25 fasten the fixed portions 54a to the swinging member 24 and to the protruding portions 25.

In FIGS. 5, 7, and 9, a measuring element/lever-receiving recess 54b is formed inside the lever support member 54. This lever support member 54 has a top portion provided with a gauge support hole 54c (FIG. 9B) extending vertically (in the Z direction) into the recess 54b. The lever support member 54 has a lower portion provided at its front end with a lever-receiving groove 54d (FIGS. 5–7) extending through the support member 54 forwardly and rearwardly,(in the X direction). As shown in FIG. 5, the recess 54b for receiving the measuring element and the lever and the groove 54d for receiving the lever are in communication with each other and have openings at their bottoms.

In FIG. 5, the X-linear gauge Lx is fixedly held to the gauge support hole 54c. The measuring element, Lxa, of the X-linear gauge Lx is positioned in the recess 54b for receiving the measuring element and the lever.

In FIGS. 7 and 9A, inwardly recessed portions 54f (FIGS. 7 and 9A) for receiving plates are formed in horizontally spaced side surfaces of the lever support member 54 above the fixed portions 54a. Horizontally extending (in the Y direction) holes 54g (FIG. 7) for receiving bearings are formed between the plate-receiving recessed portions 54f and the lever-receiving groove 54d. Vertically extending spring-receiving portions 54h (FIG. 9) are formed on horizontally spaced side surfaces of the lever support member 54. The spring-receiving portions 54h are in communication with the recess 54b for receiving the measuring element and the lever.

In FIG. 7, bearings B received in the bearing-receiving holes 54g hold both ends of a lever support shaft (arrested member-rotating shaft) 57 such that the shaft 57 can rotate. Plates 58 are screwed to the plate-receiving recessed portions 54f, respectively, and hold the bearings B in the bearing-receiving holes 54g, respectively.

In FIGS. 7 and 9, a lever 59 (slider-arresting member) is positioned in the lever-receiving groove 54d. The lever 59 is held rotatably around the Y-axis by the lever support shaft 57.

In FIG. 12, the aforementioned lever 59 is a substantially L-shaped member and has a front-end portion (on the X side) having a hole 59a and a slider-arresting portion 59b extending downward (i.e., in the −Z direction). The lever support shaft 57 extends through the hole 59a, whereby the shaft is locked. A low frictional member-receiving hole 59c is formed in the −X side surface of the slider-arresting portion 59b of the lever 59. A threaded hole 59d in which a spring is engaged is formed at the rear end (on the −X side) of the lever 59. The hole 59d extends through the lever in the Y direction. A measuring element-bearing portion 59e is formed at the rear end (on the X side) of the lever 59.

In FIG. 12A, a low frictional member 61 is received in the aforementioned low frictional member-receiving hole 59c. As shown in FIG. 5, the ball 52 ahead of (on the inner side and on the X side) the arrested portion 51c for limiting movement of the slider 51 bears against the rear-side surface (outer end surface on the −X side) of the low frictional member 61.

As shown in FIG. 5, the measuring element Lxa of the X-linear gauge Lx abuts against the measuring element-bearing surface 59e. In FIGS. 5 and 9A, spring-connecting screws 62 are screwed to the threaded hole 59d (FIG. 12A), in which the spring is engaged, from both sides of the lever 59. Respective one end of the springs 63 is connected to the spring-connecting screws 62. In FIGS. 6 and 9A, the other ends of the springs 63 are connected to spring-connecting screws 64, respectively, screwed to the top portion of the lever support member 54. In FIG. 5, the springs 63 urge the measuring element-bearing portion 59e of the lever 59 toward the linear gauge Lx (i.e., upwardly, or in the Z direction). Also, the springs 63 urge the slider-arresting portion 59b of the lever 59 toward the movement-limiting arrested portion 51c of the slider 51 (i.e., downwardly, or in the −Z direction). In this way, inward movement (in the X direction) of the slider 51 is limited.

Under the condition shown in FIG. 5, if the slider 51 moves forward or rearward (i.e., in the X direction), the slider-arresting portion 59b of the lever 59 rotates forward or rearward, moving the measuring element-abutting portion 59e vertically (i.e., in the Z direction). The X-linear gauge Lx in abutment with the measuring element-abutting portion 59e detects the amount of movement of the slider 51 in the X direction, i.e., the amount of movement of the guide pin H4 of the specimen holder H in the X direction.

In this embodiment, the amount of movement of the slider-arresting portion 59b is amplified by a factor of 3 by the lever 59 and detected by the X-linear gauge Lx.

The goniometer Gm is made up of the components 22–64, Lx, and Ly described above. The components 51–64 form a holder motion-limiting means.

In FIGS. 1 and 2, a positioning drive mechanism support member 66 is fitly mounted in the aforementioned positioning member-receiving hole 11b and in a front portion of the goniostage Gs. The hole 11b is formed in a front portion (on the X side) of the yoke 11.

The positioning drive mechanism support member 66 is provided with a slider-receiving hole 66a and a lever-receiving hole 66b lying on the X-axis. The lever-receiving hole 66b has a front portion (on the X side) provided with a gear-receiving hole 66c (FIG. 2). A threaded hole 66d (FIG. 2) extending in the X direction is formed between the lever-receiving hole 66b and the gear-receiving hole 66c. A motor-holding recess 66e (FIG. 2) is formed at the front end of the positioning drive mechanism support member 66.

A positioning slider 67 (FIGS. 1 and 2) is received in the slider-receiving hole 66a so as to be adjustable in the X direction.

In FIGS. 1 and 2, a lever 68 is held by a shaft 69 (FIG. 1) in the lever-receiving hole 66b formed in the positioning drive mechanism support member 66 so as to be rotatable around the Y-axis. One end of the lever 68 abuts against the outer end of the positioning slider 67.

In FIG. 2, a lengthwise position adjusting screw 71 is screwed into the threaded hole 66b formed in the positioning drive mechanism support member 66. The front end of the adjusting screw 71 abuts against an end portion of the lever 68 extending downward.

Referring also to FIG. 2, a toothed wheel 72 is firmly fixed to the X-direction end of the lengthwise position adjusting screw 71 and located in the toothed wheel-receiving hole 66c formed in the positioning drive mechanism support member 66. The toothed wheel 72 is in mesh with the output gear 74 of a lengthwise position adjusting motor 73, which is mounted in the motor-holding recess 66e formed in the positioning drive mechanism support member 66.

When the lengthwise position adjusting motor 73 is rotated, the lengthwise position adjusting screw 71 moves forward or rearward in the X direction via the output gear 74 and via the toothed wheel 72. This moves the end of the lever 68 in the X direction.

An inner end positioning member 76 is positioned in the positioning member-receiving hole Gs2 formed in the goniostage Gs. The inner end of the specimen holder H and the inner end of the positioning slider 67 bear against the inner end positioning member 76, which is used to determine the position of the inner end of the specimen holder H. The inner end positioning member 76 is held by the goniostage Gs so as to be movable within a quite narrow range.

A conical recess is formed at the rear end (on the X side) of the inner end positioning member 76. A ruby ball mounted at the inner end (front end) of the specimen holder H abuts against the spherical recess. The inner end positioning member 76 has a ruby ball at its front end (on the X side), and this ruby ball bears against the spherical recess at the inner end (on the -X side at the rear end) of the positioning slider 67. Accordingly, when the holder mounting member 23 supporting the specimen holder H rotates about the center O of the spherical surface, the ruby ball at the inner end (front end and on the X side) of the specimen holder H slides along the spherical recess at the inner end (rear end on the -X side) of the inner end positioning member 76. The ruby ball at the outer end (right end) of the inner end positioning member 76 slides along the spherical recess at the inner end (left end) of the positioning slider 67.

In this embodiment, the holder inner end-determining drive mechanism Dx that is an X-motion drive mechanism is made up of these components 66–76. The operation of the structure described thus far is described below.

In FIGS. 2, 5, and 8, the guide pin H4 of the specimen holder H is moved along the pin guide groove 24d in the swinging member 24 of the holder mounting member 23 to mount the specimen holder H in the holder-receiving hole 24a formed in the holder mounting member 23.

In FIGS. 2, 5, and 9, if force directed to the inner end (in the X direction) of the holder mounting member 23 is applied to the specimen holder H by atmospheric pressure during observation of the specimen, the same force applied to the inner end (in the X direction) of the holder mounting member 23 is applied to the pin engagement portion 51b of the slider 51 engaging with the guide pin H4 of the specimen holder H. The slider 51 attempts to move toward the inner end in the axial direction along the slider-receiving groove 24d in the holder mounting member 23.

However, the slider-arresting portion 59b of the lever 59 engages the movement-limiting arrested portion 51c of the slider 51 from the side of the inner end (in the X direction). The springs 63 bias the lever 59 to limit the movement of the slider 51 toward the inner end.

Therefore, the force urging the slider 51 and the specimen holder H toward the inner end (in the X direction) by the atmospheric pressure is taken up. Consequently, the force applied to the holder inner end positioning drive mechanism Dx from the inner end of the specimen holder H can be alleviated. Hence, the force does not linger in the holder inner end-positioning drive mechanism Dx. This prevents "after drift" of the specimen held to the specimen holding portion H2.

In the present embodiment, the holder inner end-positioning drive mechanism Dx does not detect the amount of detection of the specimen holder H in the X direction. Rather, the amount of movement of the specimen holder H is detected by means of the amount of movement of the slider 51 interlocking with the movement of the specimen holder H. In consequence, the position of the specimen holder H in the X direction is detected accurately. Furthermore, the sensitivity of the detection is improved, because the amount of movement of the specimen holder H in the X direction is amplified by a factor equal to the leverage.

While the preferred embodiments of the present invention have been described thus far, the invention is not limited thereto. Rather, various changes and modifications are possible within the scope of the invention delineated by the accompanying claims. Modified embodiments of the invention are given below.

In the embodiments described above, the lever 59 is used as the slider-arresting member for limiting movement of the slider 51 toward the inner end. A member other than the lever 59 may also be used to arrest the slider 51.

The lever 68 of the holder inner end-positioning drive mechanism Dx may be omitted. The front end of the lengthwise position adjusting screw 71 may directly abut against the outer end of the positioning slider 67. The positioning slider 67 may be moved forward or rearward.

The specimen holder support device in accordance with the present invention has a holder inner end-positioning drive mechanism for placing the inner end of a specimen holder in position. The specimen holder passes through an outer wall forming a chamber whose interior is maintained as a vacuum. The specimen holder support device has the advantage that the pressure applied to the holder inner end-positioning drive mechanism from the specimen holder by the atmospheric pressure (back pressure) can be alleviated. In addition, the axial position of the specimen holder can be detected accurately.

Having thus described my invention with the detail and particularity required by the Patent Laws, what is desired protected by Letters Patent is set forth in the following claims.

What is claimed is:

1. A specimen holder support device for use with an electron microscope having a wall defining a vacuum tight specimen chamber, said specimen holder support device comprising:

a cylindrical support member extending through said wall in an x direction and mounted to said wall;

a spherical bearing surface formed on an inner surface of said support member;

a generally cylindrical swinging member having a cylindrical bearing on an outer surface inserted in said support member and swingable about said spherical bearing in Y and Z directions perpendicular to each other and the X direction;

a specimen holder slidably mounted in said swinging member via an O-ring and having a front end extending inwardly beyond said spherical bearing surfaces;

an X-motion drive mechanism engaging with the front end of said specimen holder; and a specimen holder movement-arresting means spring biasing said specimen holder relative to said swinging member for alleviating force applied to said X-motion drive mechanism from said specimen holder when a vacuum is pulled on said chamber.

2. The specimen holder support device of claim 1, wherein said holder movement-arresting means is mounted to an outer surface of said swinging member and connected to said specimen holder via a hole formed in said outer surface, and wherein said specimen holder is biased away from said specimen chamber by said holder movement-arresting means.

3. The specimen holder support device of claim 2, wherein a means for detecting axial position of said specimen holder is mounted to said holder movement-arresting means.

4. A specimen holder support device for use with an electron microscope having a wall defining a specimen chamber whose interior is maintained as a vacuum, said specimen holder support device comprising:

a holder mounting member having a spherical bearing supported to said wall defining said specimen chamber, a swinging member having an inner end rotatably held by said spherical bearing, a holder-receiving hole formed in said swinging member and acting to place the interior of said specimen chamber in communication with outside, and a slider-receiving groove formed in an outer-end portion of said swinging member axially of said swinging member;

a specimen holder held in said holder-receiving hole slidably and hermetically and having an inner-end portion and a guide pin, said inner-end portion having a specimen holding portion for holding a specimen, said inner-end portion being positioned in said specimen chamber, said guide pin being mounted on an outer surface of an outer-end portion located outside said wall defining said specimen chamber, said guide pin protruding into said slider-receiving groove;

a holder inner end-positioning drive mechanism abutting against the specimen holding portion of said specimen holder to place said specimen holding portion in position axially of said swinging member;

a slider received in said slider-receiving groove so as to be movable axially of said swinging member and having a pin engagement portion and a movement-arresting portion shaped to protrude outwardly from said swinging member, said pin engagement portion engaging with the guide pin of said specimen holder;

a slider-arresting member having a slider-arresting portion for coming into engagement with said movement-arresting portion of said slider from a side of an inner end of said holder mounting member; and a spring for biasing said slider-arresting member to arrest movement of said slider toward said inner end.

5. The specimen holder support device of claim 4, wherein said slider-arresting member consists of a lever having first and second ends and held so as to be rotatable about the axis of rotation of the arresting member adjacent to the outer surface of said swinging member, said slider-arresting portion being formed at said first end, said spring being connected to said second end.

6. The specimen holder support device of claim 5, wherein there is further provided a linear gauge for measuring the amount of rotation of said lever.

7. A specimen holder support device for use with an electron microscope having a wall defining a vacuum tight specimen chamber, said specimen holder support device comprising:

a cylindrical support member extending through said wall in an x direction and mounted to said wall;

a spherical bearing surface formed on an inner surface of said support member;

a generally cylindrical swinging member having a cylindrical bearing on an outer surface inserted in said support member and swingable about said spherical bearing in Y and Z directions perpendicular to each other and the X direction;

a specimen holder slidably mounted in said swinging member via an O-ring and having a front end extending inwardly beyond said spherical bearing surfaces;

an X-motion drive mechanism for moving said specimen holder; and a specimen holder movement-arresting means spring biasing said specimen holder relative to said swinging member for alleviating force applied to said X-motion drive mechanism from said specimen holder when a vacuum is pulled on said chamber.

* * * * *

UNITED STATES PATENT AND TRADEMARK OFFICE
CERTIFICATE OF CORRECTION

PATENT NO.    : 6,469,309 B1
DATED         : October 22, 2002
INVENTOR(S)   : Tohru Kasai It is certified that error appears in the above-identified patent and that said Letters Patent is hereby corrected as shown below:

Column 1,
Line 36, after "symbol", delete the character and insert -- ⊙ --.
Line 38, after "symbol", delete the character and insert -- ⊗ --.

Column 3,
Line 14, "H. and" should read -- H, and --.

Column 6,
Line 53, "cranked 4d up" should read -- cranked up --.

Column 9,
Line 34, "rearwardly,(in" should read -- rearwardly (in --.

Signed and Sealed this

Thirteenth Day of May, 2003

JAMES E. ROGAN
*Director of the United States Patent and Trademark Office*